United States Patent
Yao et al.

(10) Patent No.: US 11,128,304 B1
(45) Date of Patent: Sep. 21, 2021

(54) CLOCK AND DATA RECOVERY DEVICE AND JITTER TOLERANCE ENHANCEMENT METHOD THEREOF

(71) Applicant: Novatek Microelectronics Corp., Hsinchu (TW)

(72) Inventors: Yun-Sheng Yao, Kaohsiung (TW); Shen-Iuan Liu, Taipei (TW); Yen-Long Lee, Tainan (TW); Peng-Yu Chen, Hsinchu (TW); Chih-Hao Huang, Tainan (TW); Yao-Hung Kuo, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/879,768

(22) Filed: May 21, 2020

(51) Int. Cl.
*H03L 7/08* (2006.01)
*H04L 7/033* (2006.01)
*G06F 1/12* (2006.01)

(52) U.S. Cl.
CPC .............. *H03L 7/0807* (2013.01); *G06F 1/12* (2013.01); *H04L 7/033* (2013.01)

(58) Field of Classification Search
CPC .......... H03L 7/0807; H04L 7/033; G06F 1/12
See application file for complete search history.

(56) References Cited

U.S. PATENT DOCUMENTS 5,448,598 A * 9/1995 Yousefi .................. H03L 7/0898
327/156
2012/0106689 A1 * 5/2012 Byun ...................... H03L 7/085
375/374

OTHER PUBLICATIONS

S. S. Saber and M. Ehsanian, "A 9-10.8 GB/s Linear Clock and Data Recovery System with Adaptive Loop Gain," Electrical Engineering (ICEE), Iranian Conference on, Mashhad, 2018, pp. 200-204, doi: 10.1109/ICEE.2018.8472670. (Year: 2018).*
H. Song, D. Kim, D. Oh, S. Kim and D. Jeong, "A 1.0-4.0-Gb/s All-Digital CDR With 1.0-ps Period Resolution DCO and Adaptive Proportional Gain Control," in IEEE Journal of Solid-State Circuits, vol. 46, No. 2, pp. 424-434, Feb. 2011, doi: 10.1109/JSSC.2010. 2082272. (Year: 2011).*
H. J. Jeon, R. Kulkarni, Y. C. Lo, J. Kim and J. Silva-Martinez, "A Bang-Bang Clock and Data Recovery Using Mixed Mode Adaptive Loop GainStrategy", IEEE Journal of Solid-State Circuits, vol. 48, No. 6, pp. 1398-1415, Jun. 2013. (Year: 2013).*
S. Jang et al., "An Optimum Loop Gain Tracking All-Digital PLL Using Autocorrelation of Bang-Bang Phase-Frequency Detection", IEEE TCAS-I, vol. 62, No. 9, pp. 836-840, Sep. 2015. (Year: 2015).*

* cited by examiner

*Primary Examiner* — Sam K Ahn
*Assistant Examiner* — Amneet Singh
(74) *Attorney, Agent, or Firm* — JCIPRNET

(57) ABSTRACT

A clock and data recovery device and a jitter tolerance enhancement method thereof are provided. The clock and data recovery device includes a clock and data recovery circuit and a jitter tolerance enhancement circuit. A data input terminal of the clock and data recovery circuit is suitable for receiving a data signal. The clock and data recovery circuit recovers the data signal to a clock. The jitter tolerance enhancement circuit is coupled to the data input terminal of the clock and data recovery circuit to receive the data signal. The jitter tolerance enhancement circuit detects a correlation between the data signal and the clock and correspondingly adjusts a loop gain of the clock and data recovery circuit according to the correlation.

13 Claims, 7 Drawing Sheets

CLOCK AND DATA RECOVERY DEVICE AND JITTER TOLERANCE ENHANCEMENT METHOD THEREOF

BACKGROUND

Technical Field

The disclosure relates to an electronic device, and in particular, to a clock and data recovery (CDR) device and a jitter tolerance enhancement method thereof.

Description of Related Art

In an integrated circuit (IC) configured to drive a liquid crystal display (LCD) panel or in other integrated circuits, the clock and data recovery (CDR) circuit may recover a data signal to the clock and data. Based on needs from different application environments, sometimes the CDR circuit requires high-frequency jitter tolerance, and sometimes the CDR circuit requires low-frequency jitter tolerance. Generally, a conventional CDR circuit cannot exhibit both high-frequency jitter tolerance and low-frequency jitter tolerance. In addition, variations in process, voltage, and temperature (PVT) may also cause jitter tolerance to be less favorable than expected.

It should be noted that the contents disclosed in the "Description of Related Art" section is used for enhancement of understanding of the disclosure. A part of the contents (or all of the contents) disclosed in the "Description of Related Art" section may not pertain to the conventional technology known to people having ordinary skill in the art. The information disclosed in the "Description of Related Art" section does not mean that the content is known to people having ordinary skill in the art before the filing of the disclosure.

SUMMARY

The disclosure provides a clock and data recovery (CDR) device and a jitter tolerance enhancement method thereof to enhance jitter tolerance of a clock and data recovery circuit.

In an embodiment of the disclosure, the clock and data recovery device includes a clock and data recovery circuit and a jitter tolerance enhancement circuit. A data input terminal of the clock and data recovery circuit is suitable for receiving a data signal. The clock and data recovery circuit is configured to recover the data signal to a clock. The jitter tolerance enhancement circuit is coupled to the data input terminal of the clock and data recovery circuit to receive the data signal. The jitter tolerance enhancement circuit detects a correlation between the data signal and the clock and correspondingly adjusts a loop gain of the clock and data recovery circuit according to the correlation.

In an embodiment of the disclosure, the jitter tolerance enhancement method includes the following steps. A data signal of a data input terminal is recovered to a clock by a clock and data recovery circuit. A correlation between the data signal and the clock is detected by a jitter tolerance enhancement circuit. Moreover, a loop gain of the clock and data recovery circuit is dynamically adjusted by the jitter tolerance enhancement circuit according to the correlation.

Based on the above, the jitter tolerance enhancement circuit provided by the disclosure may detect the data signal received by the data input terminal of the clock and data recovery circuit. The jitter tolerance enhancement circuit may detect the correlation between the data signal and the clock of the clock and data recovery circuit. Based on such correlation, the jitter tolerance enhancement circuit may dynamically adjust the loop gain of the clock and data recovery circuit to enhance the jitter tolerance of the clock and data recovery circuit.

To make the aforementioned more comprehensible, several embodiments accompanied with drawings are described in detail as follows.

DESCRIPTION OF THE EMBODIMENTS

Figure 1:
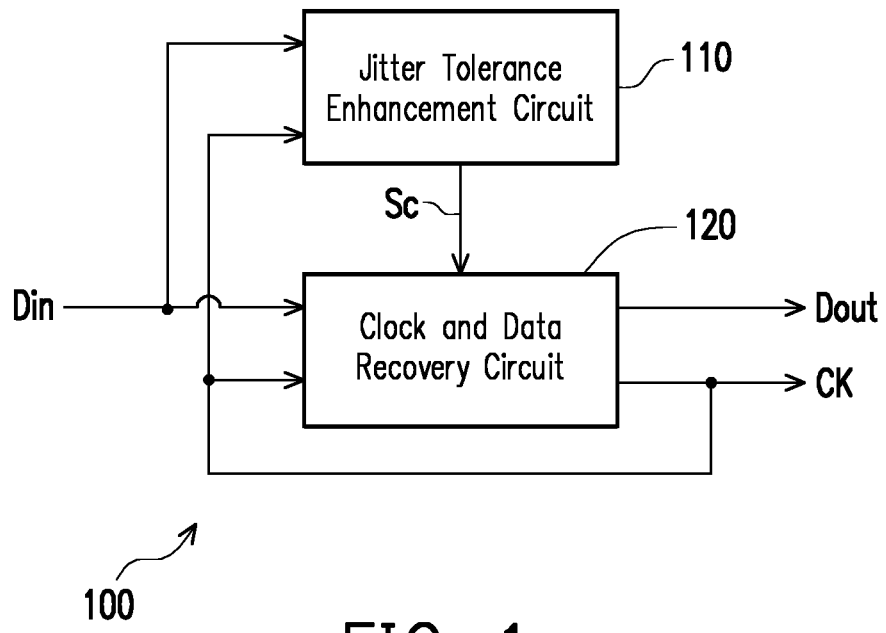
FIG. 1 is a schematic diagram of circuit blocks of a clock and data recovery device according to an embodiment of the disclosure.

The term "coupled to (or connected to)" used in the entire disclosure (including claims) refers to any direct or indirect connecting means. For example, if the disclosure describes a first apparatus is coupled to (or connected to) a second apparatus, the description should be explained as the first apparatus that is connected directly to the second apparatus, or the first apparatus, through connecting other apparatus or using certain connecting means, is connected indirectly to the second apparatus. In addition, terms such as "first" and "second" in the entire specification (including claims) are used only to name the elements or to distinguish different embodiments or scopes and should not be construed as the upper limit or lower limit of the number of any element and should not be construed to limit the order of the elements. Moreover, elements/components/steps with the same reference numerals represent the same or similar parts in the figures and embodiments where appropriate. Descriptions of the elements/components/steps with the same reference numerals or terms in different embodiments may be references for one another.

FIG. 1 is a schematic diagram of circuit blocks of a clock and data recovery (hereinafter referred to as CDR) device 100 according to an embodiment of the disclosure. The CDR device 100 shown in FIG. 1 includes a jitter tolerance enhancement circuit 110 and a CDR circuit 120. A data input terminal of the CDR circuit 120 is suitable for receiving a data signal Din. The CDR circuit 120 may recover the data signal Din to a clock CK and data Dout. Implementation details of the CDR circuit 120 are not limited by this embodiment. According to design needs, in some embodiments, the CDR circuit 120 may include a conventional CDR circuit or other CDR circuits.

Figure 2:
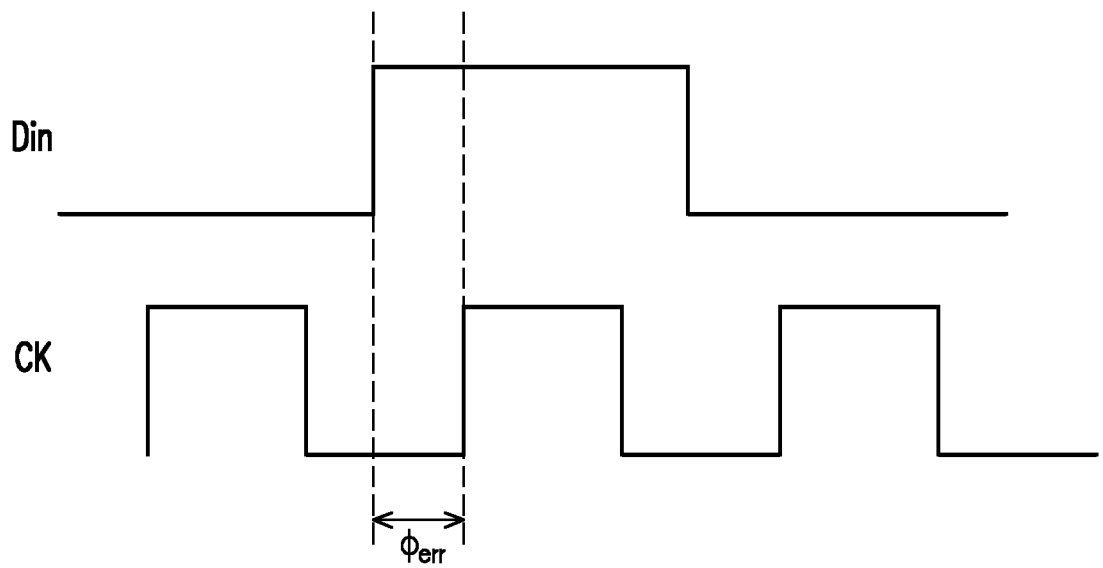
FIG. 2 is a schematic diagram illustrating a signal sequence of a data signal Din which jitters according to an embodiment of the disclosure.

In an actual application environment, the data signal Din may jitter. For instance, FIG. 2 is a schematic diagram illustrating a signal sequence of the data signal Din which jitters according to an embodiment of the disclosure. The horizontal axis shown in FIG. 2 represents time, and the vertical axis represents the signal level. With reference to FIG. 1 and FIG. 2, A noise signal may cause the data signal Din to jitter, and a phase error $\phi_{err}$ is thereby generated between the data signal Din and the clock CK. In order to allow jitter tolerance to be optimized, the jitter tolerance enhancement circuit 110 may dynamically adjust a loop gain of the CDR circuit 120 through a control signal Sc, so that the phase error $\phi_{err}$ between the clock CK and the data signal Din is minimized. For instance, when a phase moving direction of the clock CK is identical to a phase moving direction of the data signal Din, the clock CK of the CDR circuit 120 may catch up with a phase change of the data signal Din. In this way, the jitter tolerance enhancement circuit 110 may increase a bandwidth through adjusting the loop gain of the CDR circuit 120 (allowing a lock-tracking speed of the CDR circuit 120 to increase), so that the phase error $\phi_{err}$ may be reduced in real time. In contrast, when the phase moving direction of the clock CK is different from the phase moving direction of the data signal Din, the clock CK of the CDR circuit 120 may not catch up with the phase change of the data signal Din. As such, the jitter tolerance enhancement circuit 110 may decrease the bandwidth through adjusting the loop gain of the CDR circuit 120, so that a phase amount of the CDR circuit 120 performing lock-tracking in a wrong direction is decreased (the phase error $\phi_{err}$ is decreased).

Figure 3:
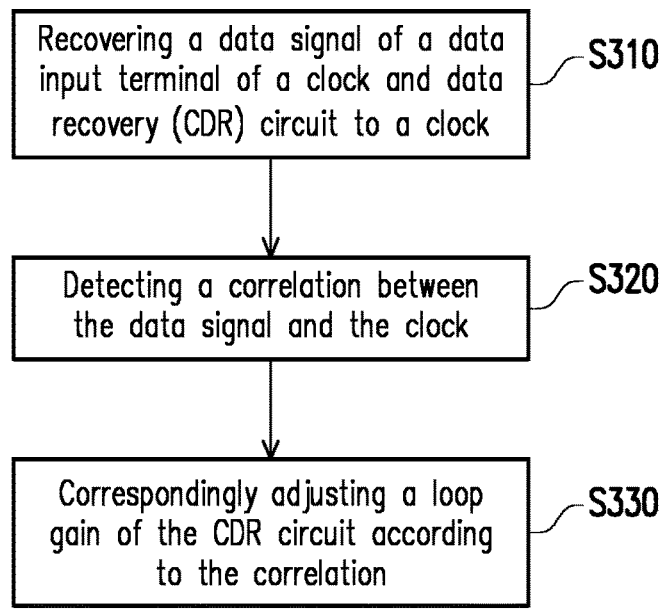
FIG. 3 is a schematic flow chart illustrating a jitter tolerance enhancement method of a clock and data recovery (CDR) device according to an embodiment of the disclosure.

FIG. 3 is a schematic flow chart illustrating a jitter tolerance enhancement method of the CDR device according to an embodiment of the disclosure. With reference to FIG. 1 and FIG. 3, in step S310, the CDR circuit 120 may recover the data signal Din to the clock CK and the data Dout. The jitter tolerance enhancement circuit 110 is coupled to the data input terminal of the CDR circuit 120 to receive the data signal Din. The jitter tolerance enhancement circuit 110 may detect the data signal Din received by the data input terminal of the CDR circuit 120. In step S320, the jitter tolerance enhancement circuit 110 may detect a correlation between the data signal Din and the clock CK. In step S330, the jitter tolerance enhancement circuit 110 may output the corresponding control signal Sc to the CDR circuit 120 according to the correlation, so as to correspondingly adjust the loop gain of the CDR circuit 120.

For instance, when the phase moving direction of the clock CK is identical to the phase moving direction of the data signal Din, the jitter tolerance enhancement circuit 110 may increase the bandwidth through adjusting the loop gain of the CDR circuit 120 (allowing the lock-tracking speed of the CDR circuit 120 to increase). In contrast, when the phase moving direction of the clock CK is different from the phase moving direction of the data signal Din, the jitter tolerance enhancement circuit 110 may decrease the bandwidth through adjusting the loop gain of the CDR circuit 120, so that the amount of phase of the CDR circuit 120 performing lock-tracking in the wrong direction may be decreased. In this way, the jitter tolerance enhancement circuit 110 may dynamically adjust the loop gain of the CDR circuit 120 according to the correlation to enhance the jitter tolerance of the clock and data recovery circuit.

Figure 4:
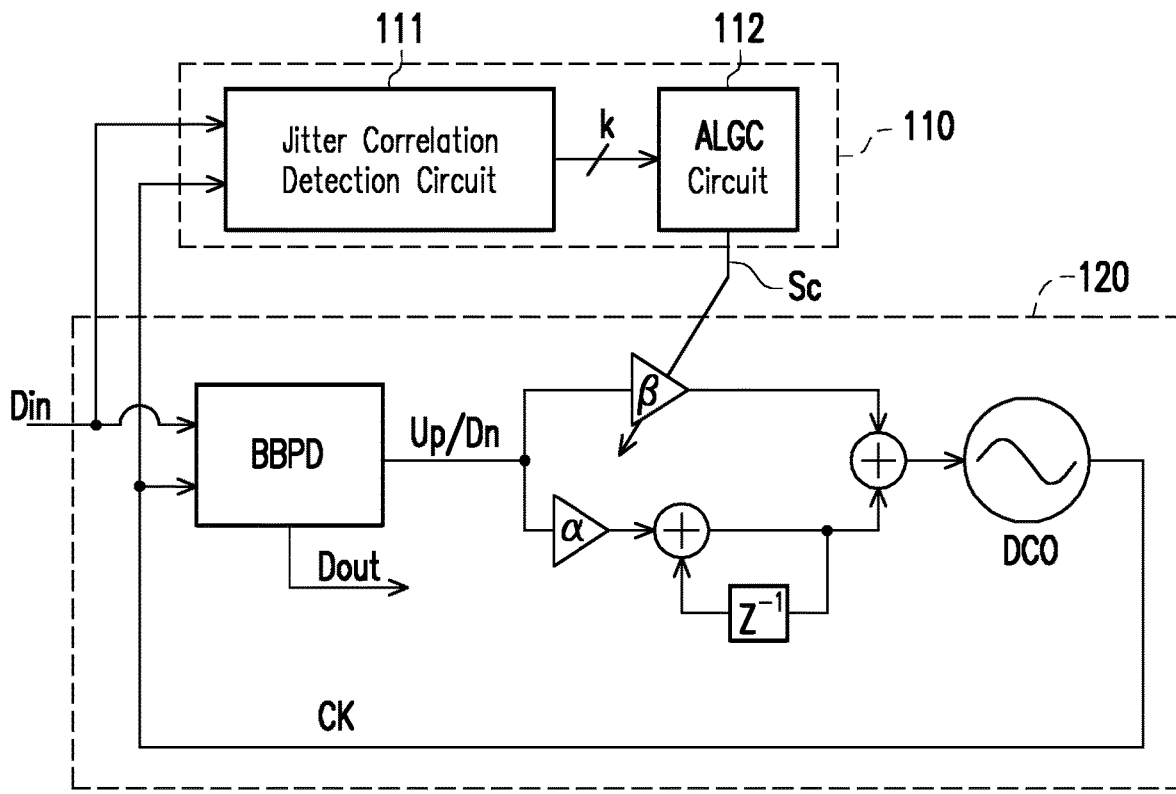
FIG. 4 is a schematic diagram illustrating circuit blocks of a jitter tolerance enhancement circuit and a CDR circuit shown in FIG. 1 according to an embodiment of the disclosure.

FIG. 4 is a schematic diagram illustrating circuit blocks of the jitter tolerance enhancement circuit 110 and the CDR circuit 120 shown in FIG. 1 according to an embodiment of the disclosure. In the embodiment of FIG. 4, the CDR circuit 120 includes a bang-bang phase detector BBPD and a digital control oscillator DCO. The CDR circuit 120 shown in FIG. 4 may be a conventional CDR circuit, and related description is thus not provided herein. The jitter tolerance enhancement circuit 110 may dynamically adjust a loop gain β of the CDR circuit 120 through the control signal Sc.

In the embodiment of FIG. 4, the jitter tolerance enhancement circuit 110 includes a jitter correlation detection circuit 111 and an adaptive loop gain control (hereinafter referred to as ALGC) circuit 112. The jitter correlation detection circuit 111 is coupled to the data input terminal of the CDR circuit 120 to receive the data signal Din. The jitter correlation detection circuit 111 may detect the correlation between the data signal Din and the clock CK. The jitter correlation detection circuit 111 may output a coefficient k corresponding to the correlation to the ALGC circuit 112.

The ALGC circuit 112 is coupled to the jitter correlation detection circuit 111 to receive the coefficient k. Through the control signal Sc, the ALGC circuit 112 may correspondingly adjust the loop gain β of the CDR circuit 120 according to the coefficient k. The ALGC circuit 112 may optimize the loop gain β, so as to further optimize the jitter tolerance.

Figure 5:
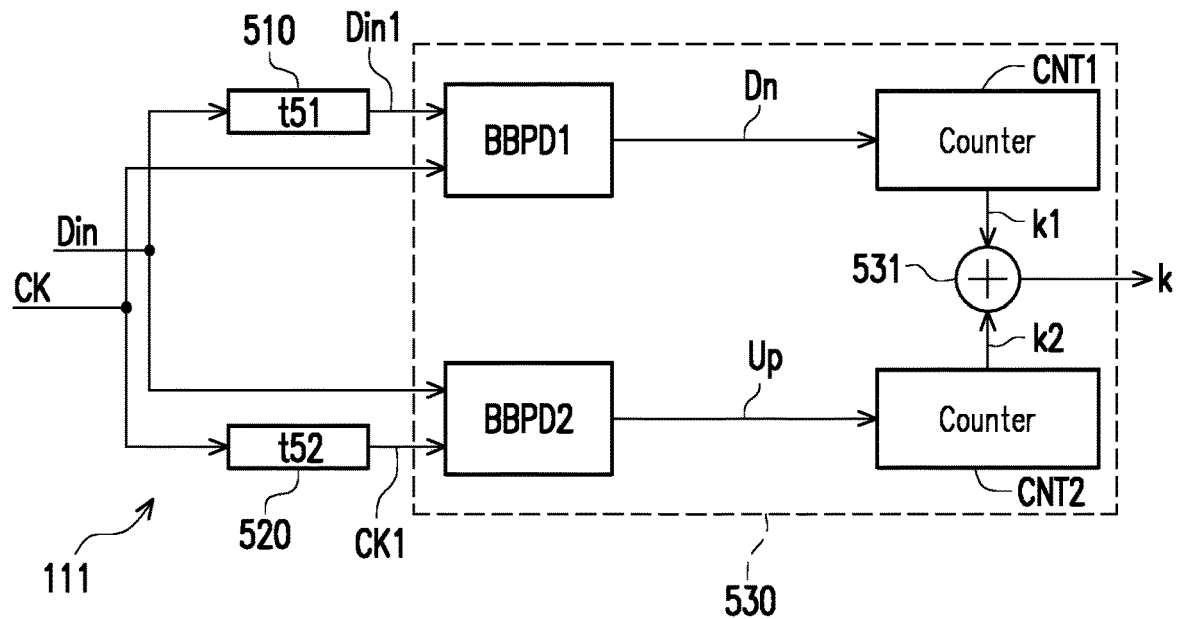
FIG. 5 is a schematic diagram illustrating circuit blocks of a jitter correlation detection circuit shown in FIG. 4 according to an embodiment of the disclosure.
Figure 6A:
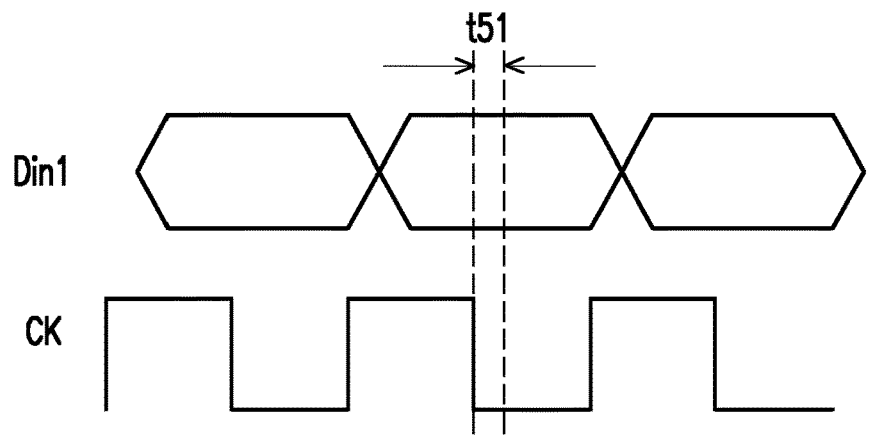
FIG. 6A is a schematic diagram illustrating signal sequences of a delayed data signal and a clock shown in FIG. 5 according to an embodiment of the disclosure.

FIG. 5 is a schematic diagram illustrating circuit blocks of the jitter correlation detection circuit 111 shown in FIG. 4 according to an embodiment of the disclosure. In the embodiment of FIG. 5, the jitter correlation detection circuit 111 includes a delay circuit 510, a delay circuit 520, and a phase detection circuit 530. The delay circuit 510 is coupled to the data input terminal of the CDR circuit 120 to receive the data signal Din. The delay circuit 510 may delay (delay time is t51) the data signal Din and outputs a delay result to act as a delayed data signal Dint. For instance, FIG. 6A is a schematic diagram illustrating signal sequences of the delayed data signal Dint and the clock CK shown in FIG. 5 according to an embodiment of the disclosure. The horizontal axis shown in FIG. 6A represents time, and the vertical axis represents the signal level. With reference to FIG. 5 and FIG. 6A, the delay circuit 510 may delay (the delay time is t51) the data signal Din to output the delayed data signal Din1 to the phase detection circuit 530. The delay time t51 may be determined according to design needs.

Figure 6B:
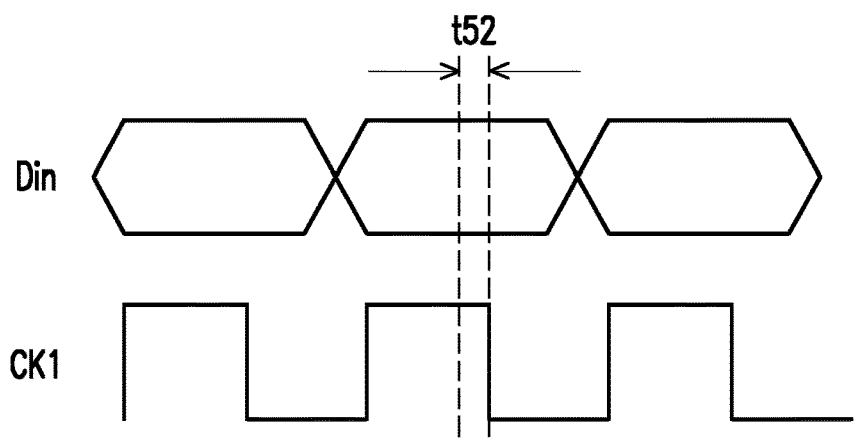
FIG. 6B is a schematic diagram illustrating signal sequences of the data signal and a delayed clock shown in FIG. 5 according to an embodiment of the disclosure.

The delay circuit 520 shown in FIG. 5 is coupled to the CDR circuit 120 to receive the clock CK. The delay circuit 520 may delay (the delay time is t52) the clock CK and outputs a delay result to act a delayed clock CK1. For instance, FIG. 6B is a schematic diagram illustrating signal sequences of the data signal Din and the delayed clock CK1 shown in FIG. 5 according to an embodiment of the disclosure. The horizontal axis shown in FIG. 6B represents time, and the vertical axis represents the signal level. With reference to FIG. 5 and FIG. 6B, the delay circuit 520 may delay (the delay time is t52) the clock CK to output the delayed clock CK1 to the phase detection circuit 530. The delay time t52 may be determined according to design needs.

With reference to FIG. 5, FIG. 6A, and FIG. 6B, the phase detection circuit 530 is coupled to the CDR circuit 120, the delay circuit 510, and the delay circuit 520. The phase detection circuit 530 may detect a phase relationship between the delayed data signal Dint and the clock CK to obtain a detection result Dn. The phase detection circuit 530 may detect a phase relationship between the data signal Din and the delayed clock CK1 to obtain a detection result Up. The phase detection circuit 530 may output the coefficient k corresponding to the detection result Dn and the detection result Up to the ALGC circuit 112.

In the embodiment of FIG. 5, the phase detection circuit 530 may include a phase detector BBPD1, a phase detector BBPD2, a counter CNT1, a counter CNT2, and an adder 531. The phase detector BBPD1 is coupled to the CDR circuit 120 and the delay circuit 510. The phase detector BBPD1 may detect the phase relationship between the delayed data signal Dint and the clock CK to obtain the detection result Dn. The detection result Dn may indicate that whether a phase of the clock CK leads a phase of the delayed data signal Dint. For instance, when the CDR circuit 120 correctly locks a phase of the data signal Din, the detection result Dn may be set to logic "1" to indicate that "the phase of the clock CK leads the phase of the delayed data signal Din1". When the data signal Din jitters so that the phase of the clock CK lags the phase of the delayed data signal Din1, the phase detector BBPD1 may set the detection result Dn to logic "0". Implementation details of the phase detector BBPD1 are not limited by this embodiment. According to design needs, in some embodiments, the phase detector BBPD1 may include a bang-bang phase detector or other phase detectors.

The phase detector BBPD2 is coupled to the CDR circuit 120 and the delay circuit 520. The phase detector BBPD2 may detect the phase relationship between the data signal Din and the delayed clock CK1 to obtain the detection result Up. The detection result Up may indicate that whether a phase of the delayed clock CK1 lags the phase of the data signal Din. For instance, when the CDR circuit 120 correctly locks the phase of the data signal Din, the detection result Up may be set to logic "1" to indicate that "the phase of the delayed clock CK1 lags the phase of the data signal Din". When the data signal Din jitters so that the phase of the delayed clock CK1 leads the phase of the data signal Din, the phase detector BBPD1 may set the detection result Up to logic "0". Implementation details of the phase detector BBPD2 are not limited by this embodiment. According to design needs, in some embodiments, the phase detector BBPD2 may include a bang-bang phase detector or other phase detectors.

The counter CNT1 is coupled to the phase detector BBPD1 to receive the detection result Dn. The counter CNT1 is configured to count a number of occurrences of "the phase of the clock CK leads the phase of the delayed data signal Din1" in a counting period and treats the number of occurrences as a leading number value k1. The counter CNT2 is coupled to the phase detector BBPD2 to receive the detection result Up. The counter CNT2 is configured to count a number of occurrences of "the phase of the delayed clock CK1 lags the phase of the data signal Din" in the counting period and treats the number of occurrences as a lagging number value k2.

The adder 531 is coupled to the counter CNT1 and the counter CNT2 to receive the leading number value k1 and the lagging number value k2. The adder 531 outputs a total value (acting as the coefficient k) of the leading number value k1 and the lagging number value k2 to the ALGC circuit 112. When jitter occurs, a probability of the detection result Dn of the phase detector BBPD1 (or the detection result Up outputted by the phase detector BBPD2) being logic "1" is lowered. When the leading number value k1 and the lagging number value k2 are added up, the number of counting and the convergence speed are increased.

The counter CNT1 and the counter CNT2 are reset after the counting period is over every time. That is, the coefficient k is reset after the counting period is over every time, so that k is re-counted. The counting period is defined as TNs, and when the coefficient k accumulated in the counting period TNs increases, the correlation between the data signal Din and the clock CK enhances. The coefficients k in different counting periods may be transmitted to the ALGC circuit 112 to perform a ALGC algorithm (configured to automatically adjust the loop gain β of the CDR circuit 120).

Figure 7:
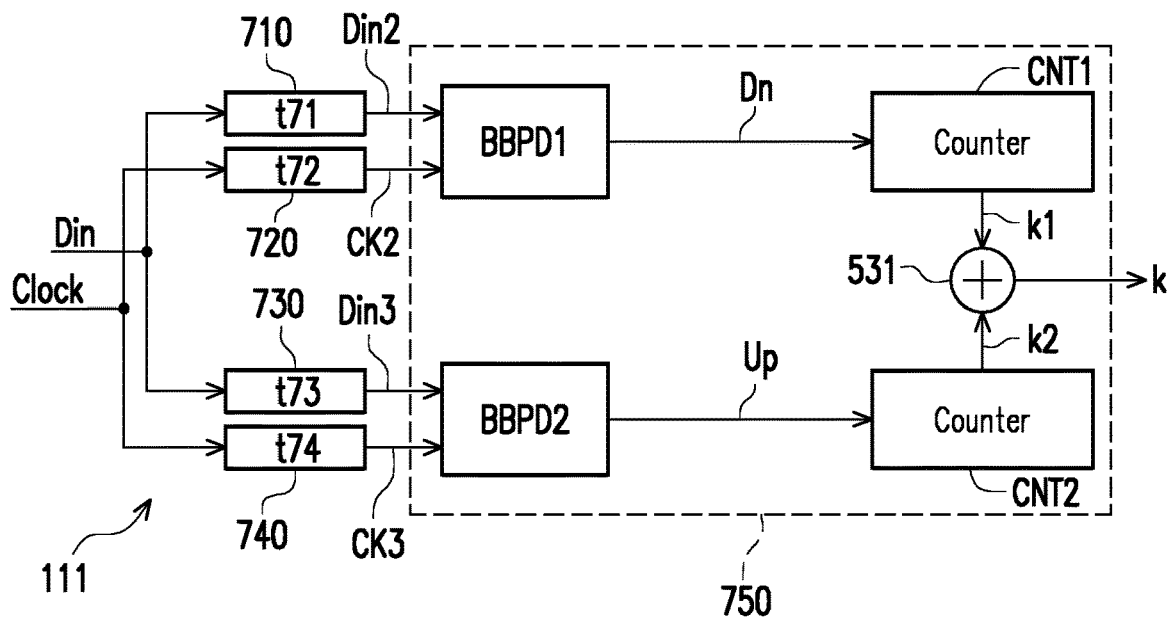
FIG. 7 is a schematic diagram illustrating circuit blocks of the jitter correlation detection circuit shown in FIG. 4 according to another embodiment of the disclosure.

FIG. 7 is a schematic diagram illustrating circuit blocks of the jitter correlation detection circuit 111 shown in FIG. 4 according to another embodiment of the disclosure. In the embodiment of FIG. 7, the jitter correlation detection circuit 111 includes a delay circuit 710, a delay circuit 720, a delay circuit 730, a delay circuit 740, and a phase detection circuit 750. The delay circuit 710 is coupled to the data input terminal of the CDR circuit 120 to receive the data signal Din. The delay circuit 710 may delay (the delay time is t71) the data signal Din and outputs a delay result to act as a delayed data signal Din2. The delay circuit 720 is coupled to the CDR circuit 120 to receive the clock CK. The delay circuit 720 may delay (the delay time is t72) the clock CK and outputs a delay result to act a delayed clock CK2. The delay time t72 and the delay time t72 may be determined according to design needs.

Figure 8A:
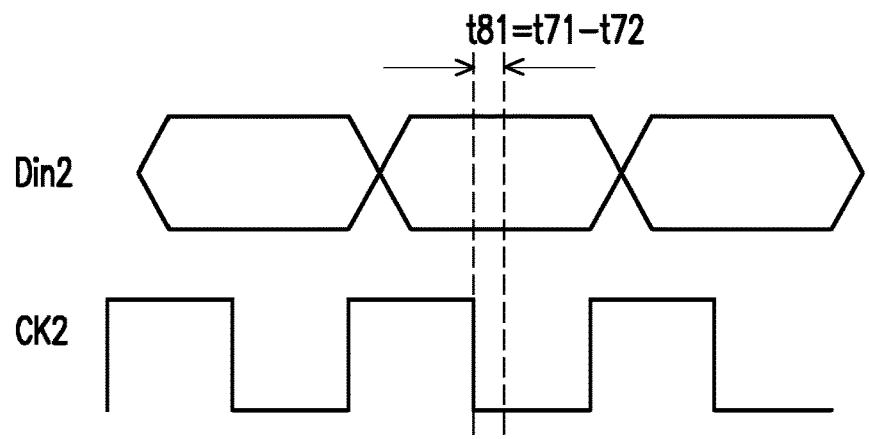
FIG. 8A is a schematic diagram illustrating signal sequences of a delayed data signal Din2 and a delayed clock CK2 shown in FIG. 7 according to an embodiment of the disclosure.

For instance, FIG. 8A is a schematic diagram illustrating signal sequences of the delayed data signal Din2 and the delayed clock CK2 shown in FIG. 7 according to an embodiment of the disclosure. The horizontal axis shown in FIG. 8A represents time, and the vertical axis represents the signal level. With reference to FIG. 7 and FIG. 8A, the delay circuit 710 may delay (the delay time is t71) the data signal Din to output the delayed data signal Din2 to the phase detection circuit 750. The delay circuit 720 may delay (the delay time is t72) the clock CK to output the delayed clock CK2 to the phase detection circuit 750. In the embodiment of FIG. 8A, the delay time of t71 is greater than the delay time of t72, and a phase difference t81 between the delayed clock CK2 and the delayed data signal Din2 is t71-t72.

The delay circuit 730 shown in FIG. 7 is coupled to the data input terminal of the CDR circuit 120 to receive the data signal Din. The delay circuit 730 may delay (the delay time is t73) the data signal Din and outputs a delay result to act as a delayed data signal Din3. The delay circuit 740 is coupled to the CDR circuit 120 to receive the clock CK. The delay circuit 740 may delay (the delay time is t74) the clock CK and outputs a delay result to act a delayed clock CK3. The delay time t73 and the delay time t74 may be determined according to design needs.

Figure 8B:
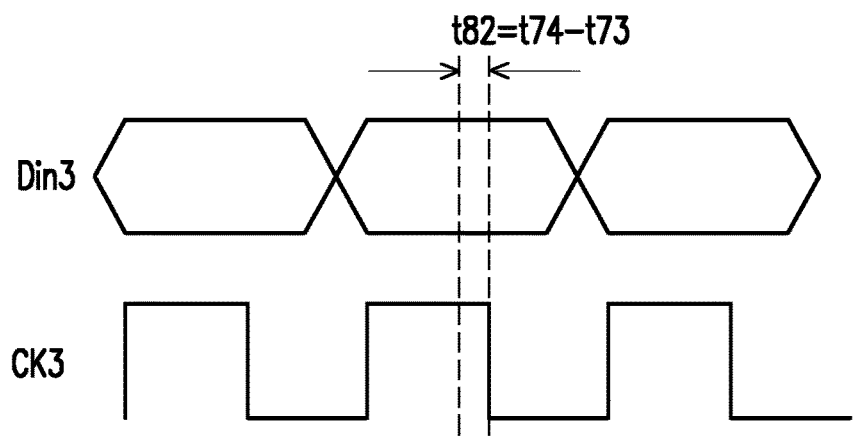
FIG. 8B is a schematic diagram illustrating signal sequences of a delayed data signal Din3 and a delayed clock CK3 shown in FIG. 7 according to an embodiment of the disclosure.

For instance, FIG. 8B is a schematic diagram illustrating signal sequences of the delayed data signal Din3 and the delayed clock CK3 shown in FIG. 7 according to an embodiment of the disclosure. The horizontal axis shown in FIG. 8B represents time, and the vertical axis represents the signal level. With reference to FIG. 7 and FIG. 8B, the delay circuit 730 may delay (the delay time is t73) the data signal Din and outputs the delayed data signal Din3 to the phase detection circuit 750. The delay circuit 740 may delay (the delay time is t74) the clock CK and outputs the delayed clock CK3 to the phase detection circuit 750. In the embodiment of FIG. 8B, the delay time of t74 is greater than the delay time of t73, and a phase difference t82 between the delayed clock CK3 and the delayed data signal Din3 is t74-t73.

With reference to FIG. 7, FIG. 8A, and FIG. 8B, the phase detection circuit 750 is coupled to the CDR circuit 120, the delay circuit 710, the delay circuit 720, the delay circuit 730, and the delay circuit 740. The phase detection circuit 750 may detect a phase relationship between the delayed data signal Din2 and the delayed clock CK2 to obtain the detection result Dn. The phase detection circuit 750 may detect a phase relationship between the delayed data signal Din3 and the delayed clock CK3 to obtain the detection result Up. The phase detection circuit 750 may output the coefficient k corresponding to the detection result Dn and the detection result Up to the ALGC circuit 112.

In the embodiment of FIG. 7, the phase detection circuit 750 may include the phase detector BBPD1, the phase detector BBPD2, the counter CNT1, the counter CNT2, and the adder 531. The phase detector BBPD1 shown in FIG. 7 is coupled to the delay circuit 710 and the delay circuit 720. The phase detector BBPD1 may detect the phase relationship between the delayed data signal Din2 and the delayed clock CK2 to obtain the detection result Dn. The counter CNT1 shown in FIG. 7 is coupled to the phase detector BBPD1 to receive the detection result Dn. The counter CNT1 may count a number of occurrences of "a phase of the delayed clock CK2 leads a phase of the delayed data signal Din2" in a counting period (as a leading number value k1).

The phase detector BBPD2 shown in FIG. 7 is coupled to the delay circuit 730 and the delay circuit 740. The phase detector BBPD2 may detect the phase relationship between the delayed data signal Din3 and the delayed clock CK3 to obtain the detection result Up. The counter CNT2 is coupled to the phase detector BBPD2 to receive the detection result Up. The counter CNT2 may count a number of occurrences of "a phase of the delayed clock CK3 lags a phase of the delayed data signal Din3" in the counting period (as a lagging number value k2).

Description of the phase detector BBPD1, the phase detector BBPD2, the counter CNT1, the counter CNT2, and the adder 531 shown in FIG. 7 may be deduced with reference to the description related to the phase detector BBPD1, the phase detector BBPD2, the counter CNT1, the counter CNT2, and the adder 531 shown in FIG. 5, and repeated description is thus not provided herein. The adder 531 may transmit the coefficients k in different counting periods to the ALGC circuit 112 to perform a ALGC algorithm (configured to automatically adjust the loop gain β of the CDR circuit 120).

Figure 9:
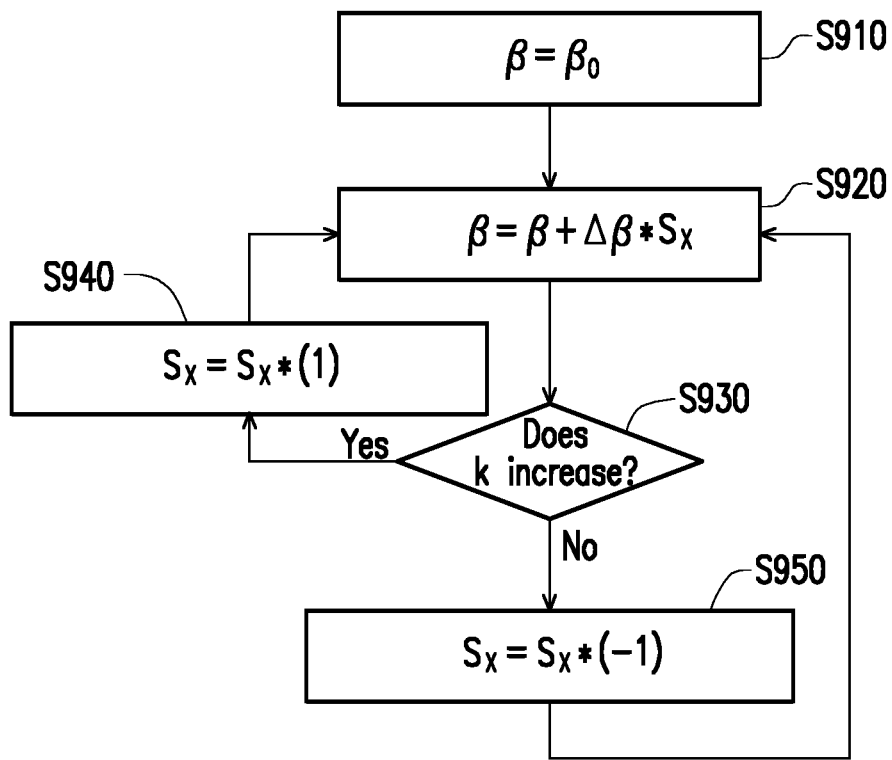
FIG. 9 is a schematic flow chart illustrating performance of an algorithm by an adaptive loop gain control (ALGC) circuit of FIG. 4 according to an embodiment of the disclosure.

FIG. 9 is a schematic flow chart illustrating performance of an algorithm by the ALGC circuit 112 of FIG. 4 according to an embodiment of the disclosure. With reference to FIG. 4 and FIG. 9, The ALGC circuit 112 may check the coefficient k and dynamically adjusts the loop gain β of the CDR circuit 120 according to a checking result. In step S910, the ALGC circuit 112 may initialize the loop gain β of the CDR circuit 120. For instance, the ALGC circuit 112 may initialize and reset the loop gain β of the CDR circuit 120 to an initial value β0. The initial value β0 may be defined according to design needs. The ALGC circuit 112 may initialize a sign variable Sx to be "+1" in step S910.

In step S920, the ALGC circuit 112 may adjust the loop gain β of the CDR circuit 120 by using the gain step value Δβ. For instance, the ALGC circuit 112 may add the product of the gain step value Δβ and the sign variable Sx (i.e. Δβ*Sx) to the original loop gain β to obtain a new loop gain β of the CDR circuit 120. When step S920 is performed for the first time, the gain step value Δβ may be a predefined initial value (defined according to design needs).

In step S930, the ALGC circuit 112 may compare the coefficient k of the current counting period with the coefficient k of the previous counting period to determine whether the coefficient k changes. When the coefficient k increases ("Yes" is determined in step S930), the ALGC circuit 112 may perform step S940. In step S940, the ALGC circuit 112 may keep the sign variable Sx (i.e. Sx=Sx*(1)). Therefore, the ALGC circuit 112 may raise the loop gain β of the CDR circuit 120 (step S920).

When the coefficient k decreases ("No" is determined in step S930), the ALGC circuit 112 may perform step S950. In step S950, the ALGC circuit 112 may reverse the sign variable Sx (i.e. Sx=Sx*(−1)). Therefore, the ALGC circuit 112 may lower the loop gain β of the CDR circuit 120 (step S920).

Figure 10:
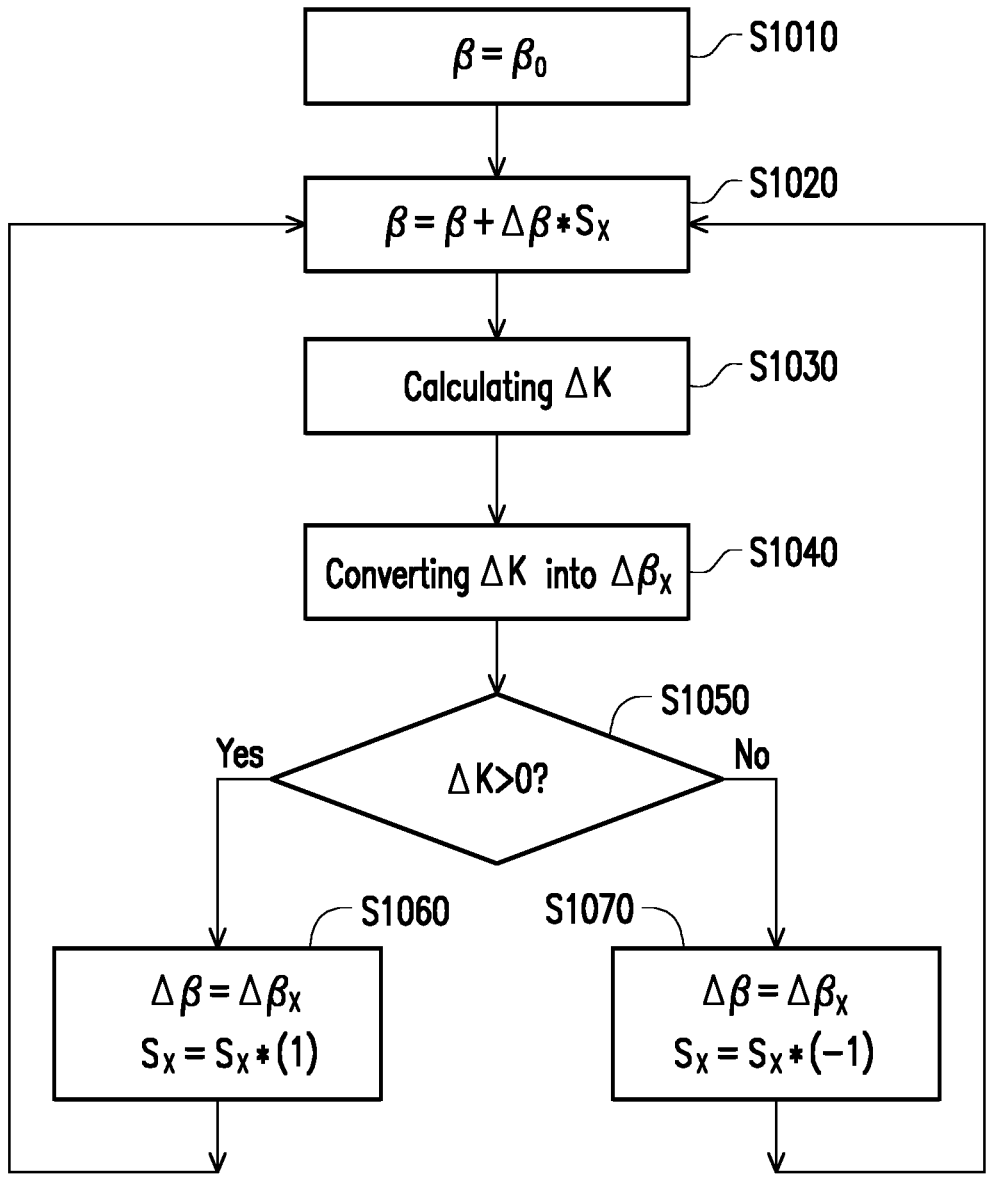
FIG. 10 is a schematic flow chart illustrating performance of an algorithm by the ALGC circuit of FIG. 4 according to another embodiment of the disclosure.

FIG. 10 is a schematic flow chart illustrating performance of an algorithm by the ALGC circuit 112 of FIG. 4 according to another embodiment of the disclosure. With reference to FIG. 4 and FIG. 10, In step S1010, the ALGC circuit 112 may initialize the loop gain β of the CDR circuit 120. For instance, the ALGC circuit 112 may initialize and reset the loop gain β of the CDR circuit 120 to the initial value $\beta_0$. The initial value $\beta_0$ may be defined according to design needs. The ALGC circuit 112 may initialize a sign variable Sx to be "+1" in step S1010.

In step S1020, the ALGC circuit 112 may adjust the loop gain β of the CDR circuit 120 by using the gain step value Δβ. For instance, the ALGC circuit 112 may add the product of the gain step value Δβ and the sign variable Sx (i.e. Δβ*Sx) to the original loop gain β to obtain the new loop gain β of the CDR circuit 120. When step S1020 is performed for the first time, the gain step value Δβ may be a predefined initial value $\Delta\beta_0$. The initial value $\Delta\beta_0$ may be defined according to design needs.

In step S1030, the ALGC circuit 112 may calculate a coefficient difference value Δk between the coefficient k in the current counting period and the coefficient k in the previous counting period. In step S1040, the ALGC circuit 112 may convert the coefficient difference value Δk into a gain step value $\Delta\beta_x$ according to a predefined corresponding relationship. The corresponding relationship may be defined according to design needs. For instance, in some embodiments, the ALGC circuit 112 may quantify the coefficient difference value Δk so as to determine the gain step value $\Delta\beta_x$ in step S1040. Alternatively, the ALGC circuit 112 may convert the coefficient difference value Δk into the gain step value $\Delta\beta_x$ by using a corresponding relationship shown in FIG. 11 in step S1040.

Figure 11:
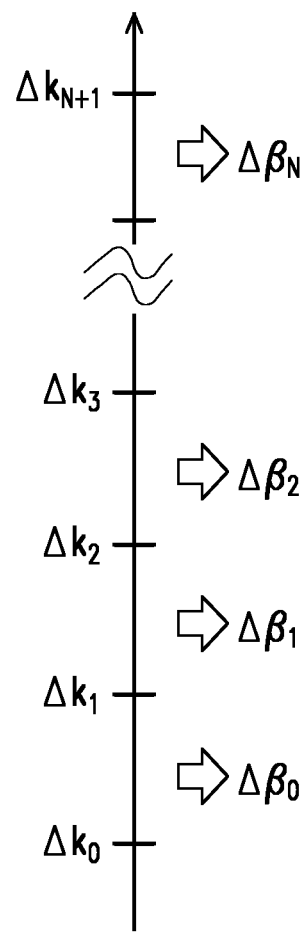
FIG. 11 is a schematic diagram illustrating a corresponding relationship between a coefficient difference value $\Delta k$ and a gain step value $\Delta \beta_x$ according to an embodiment of the disclosure.

FIG. 11 is a schematic diagram illustrating a corresponding relationship between the coefficient difference value Δk and the gain step value $\Delta\beta_x$ according to an embodiment of the disclosure. The vertical axis shown in FIG. 11 represents the coefficient difference value Δk. The coefficient difference values $\Delta k_0, \Delta k_1, \Delta k_2, \Delta k_3, \ldots,$ and $\Delta k_{N+1}$ shown in FIG. 11 may be defined according to design needs. The gain step values $\Delta\beta_0, \Delta\beta_1, \Delta\beta_2, \ldots$, and $\Delta\beta_N$ (i.e., the gain step value $\Delta\beta_x$ shown in FIG. 11 may be defined according to design needs.

With reference to FIG. 4, FIG. 10, and FIG. 11, in step S1040, when the coefficient difference value $|\Delta k|$ (i.e., an absolute value of the coefficient difference value $\Delta k$) falls between $\Delta k_0$ and $\Delta k_1$, the ALGC circuit 112 may convert the coefficient difference value $\Delta k$ into the gain step value $\Delta\beta_0$. When the coefficient difference value $|\Delta k|$ falls between $\Delta k_1$ and $\Delta k_2$, the ALGC circuit 112 may convert the coefficient difference value $\Delta k$ into the gain step value $\Delta\mu 1$. When the coefficient difference value $|\Delta k|$ falls between $\Delta k_2$ and $\Delta k_3$, the ALGC circuit 112 may convert the coefficient difference value $\Delta k$ into the gain step value $\Delta\beta_2$. The rest of the coefficient difference values $\Delta k$ may be deduced analogy, and repeated description is thus not provided herein. Therefore, the ALGC circuit 112 may convert the coefficient difference value $\Delta k$ into the gain step value $\Delta\beta_x$ by using the corresponding relationship shown in FIG. 11 in step S1040.

With reference to FIG. 4 and FIG. 10, in step S1050, the ALGC circuit 112 may determine whether the coefficient difference value $\Delta k$ is greater than 0. That is, the ALGC circuit 112 may determine whether the coefficient k increases. When the coefficient k increases ("Yes" is determined in step S1050), the ALGC circuit 112 may perform step S1060. In step S1060, the ALGC circuit 112 may keep the sign variable Sx (i.e. Sx=Sx*(1)). Based on the gain step value $\Delta\beta_x$ determined in step S1040, the ALGC circuit 112 may set the gain step value $\Delta\beta$ to be the gain step value $\Delta\beta_x$ in step S1060. Therefore, the ALGC circuit 112 may raise the loop gain $\beta$ (step S1020) of the CDR circuit 120 by using the gain step value $\Delta\beta_x$ dynamically determined in step S1040.

When the coefficient k decreases ("No" is determined in step S1050), the ALGC circuit 112 may perform step S1070. In step S1070, the ALGC circuit 112 may reverse the sign variable Sx (i.e. Sx=Sx*(-1)). Based on the gain step value $\Delta\beta_x$ determined in step S1040, the ALGC circuit 112 may set the gain step value $\Delta\beta$ to be the gain step value $\Delta\beta_x$ in step S1070. Therefore, the ALGC circuit 112 may lower the loop gain $\beta$ (step S1020) of the CDR circuit 120 by using the gain step value $\Delta\beta_x$ dynamically determined in step S1040.

After the loop gain $\beta$ (step S1020) is increased or decreased each time, the ALGC circuit 112 may observe whether the coefficient difference value $\Delta k$ is greater than 0 (step S1050). If the coefficient difference value $\Delta k$ is greater than 0, it means that the loop gain $\beta$ converges in a correct direction. If the coefficient difference value $\Delta k$ is less than 0, it means that the direction in which the loop gain $\beta$ converges needs to be corrected. When the coefficient difference value $|\Delta k|$ increases, the gain step value $|\Delta\beta|$ increases, so that the ALGC circuit 112 may accelerate the initial convergence speed and improves stability after convergence.

According to different design needs, the blocks of the jitter tolerance enhancement circuit 110, the jitter correlation detection circuit 111, and/or the ALGC circuit 112 may be implemented in the form of hardware, firmware, software (i.e., a program), or a combination of the majority of the foregoing three.

In the form of hardware, the blocks of the jitter tolerance enhancement circuit 110, the jitter correlation detection circuit 111, and/or the ALGC circuit 112 may be implemented in the form of a logic circuit on an integrated circuit. Related functions of the jitter tolerance enhancement circuit 110, the jitter correlation detection circuit 111, and/or the ALGC circuit 112 may be implemented as hardware through using hardware description languages (e.g., Verilog HDL or VHDL) or other suitable programming languages. For instance, the related function of the jitter tolerance enhancement circuit 110, the jitter correlation detection circuit 111, and/or the ALGC circuit 112 may be implemented in one or a plurality of controllers, a micro controller, a micro processor, an application-specific integrated circuit (ASIC), a digital signal processor (DSP), a field programmable gate array (FPGA), and/or various logic blocks, module, and circuits in other processing units.

In the form of software and/or firmware, the related functions of the jitter tolerance enhancement circuit 110, the jitter correlation detection circuit 111, and/or the ALGC circuit 112 may be implemented as programming codes. For instance, the jitter tolerance enhancement circuit 110, the jitter correlation detection circuit 111, and/or the ALGC circuit 112 may be implemented by using a general programming language (e.g., C, C++, or an assembly language) or other suitable programming languages. The programming code may be recorded/stored in a recording medium, and the recording medium includes, for example, read only memory (ROM), a storage device, and/or random access memory (RAM). A computer, a central processing unit (CPU), a controller, a micro controller, or a micro processor may read and execute the programming code from the recording medium to accomplish the related functions. In terms of the recording medium, a "non-transitory computer readable medium" may be used. For instance, a tape, a disk, a card, semiconductor memory, a programmable logic circuit, etc. may be used. Further, the program may also be provided to the computer (or CPU) through any transmission medium (a communication network or a broadcast wave, etc.). The communication network includes, for example, Internet, wired communication, wireless communication, or other communication media.

In view of the foregoing, the jitter tolerance enhancement circuit 110 provided in the embodiments may detect the data signal Din received by the data input terminal of the CDR circuit 120. The jitter tolerance enhancement circuit 110 may detect the correlation between the data signal Din and the clock CK. Based on such correlation, the jitter tolerance enhancement circuit 110 may dynamically adjust the loop gain $\beta$ of the CDR circuit 120 to enhance the jitter tolerance of the CDR circuit 120.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A clock and data recovery device, comprising:
   a clock and data recovery circuit, having a data input terminal suitable for receiving a data signal, disposed to recover the data signal to a clock; and
   a jitter tolerance enhancement circuit, coupled to the data input terminal of the clock and data recovery circuit to receive the data signal, wherein the jitter tolerance enhancement circuit detects a correlation between the data signal and the clock and correspondingly adjusts a loop gain of the clock and data recovery circuit according to the correlation, wherein the jitter tolerance enhancement circuit comprises:
      a jitter correlation detection circuit, coupled to the data input terminal of the clock and data recovery circuit to receive the data signal, wherein the jitter correlation detection circuit detects the correlation between the data signal and the clock, and the jitter correlation detection circuit outputs a coefficient corresponding to the correlation; and an adaptive loop gain control circuit, coupled to the jitter correlation detection circuit to receive the coefficient, wherein the adaptive loop gain control circuit correspondingly adjusts the loop gain of the clock and data recovery circuit according to the coefficient, wherein the jitter correlation detection circuit comprises:

a first delay circuit, coupled to the data input terminal of the clock and data recovery circuit to receive the data signal, wherein the first delay circuit outputs a delayed data signal;

a second delay circuit, coupled to the clock and data recovery circuit to receive the clock, wherein the second delay circuit outputs a delayed clock; and a phase detection circuit, coupled to the clock and data recovery circuit to receive the data signal and the clock, coupled to the first delay circuit to receive the delayed data signal, and coupled to the second delay circuit to receive the delayed clock, wherein the phase detection circuit detects a phase relationship between the delayed data signal and the clock to obtain a first detection result, the phase detection circuit detects a phase relationship between the data signal and the delayed clock to obtain a second detection result, and the phase detection circuit outputs the coefficient corresponding to the first detection result and the second detection result to the adaptive loop gain control circuit.

2. The clock and data recovery device according to claim 1, wherein the phase detection circuit comprises:

a first phase detector, coupled to the clock and data recovery circuit and the first delay circuit, wherein the first phase detector detects the phase relationship between the delayed data signal and the clock to obtain the first detection result, and the first detection result indicates that whether a phase of the clock leads a phase of the delayed data signal;

a second phase detector, coupled to the clock and data recovery circuit and the second delay circuit, wherein the second phase detector detects the phase relationship between the data signal and the delayed clock to obtain the second detection result, and the second detection result indicates that whether a phase of the delayed clock lags a phase of the data signal;

a first counter, coupled to the first phase detector to receive the first detection result, wherein the first counter is configured to count a number of occurrences of "the phase of the clock leads the phase of the delayed data signal" in a counting period as a leading number value;

a second counter, coupled to the second phase detector to receive the second detection result, wherein the second counter is configured to count a number of occurrences of "the phase of the delayed clock lags the phase of the data signal" in the counting period as a lagging number value; and an adder, coupled to the first counter and the second counter to receive the leading number value and the lagging number value, wherein the adder outputs a total value of the leading number value and the lagging number value to act as the coefficient to the adaptive loop gain control circuit.

3. The clock and data recovery device according to claim 2, wherein the first phase detector and the second phase detector are bang-bang phase detectors.

4. The clock and data recovery device according to claim 1, wherein the adaptive loop gain control circuit checks the coefficient, the adaptive loop gain control circuit raises the loop gain of the clock and data recovery circuit when the coefficient increases, and the adaptive loop gain control circuit lowers the loop gain of the clock and data recovery circuit when the coefficient decreases.

5. The clock and data recovery device according to claim 1, wherein the adaptive loop gain control circuit calculates a coefficient difference value between the coefficient in a current counting period and the coefficient in a previous counting period, the adaptive loop gain control circuit converts the coefficient difference value into a gain step value according to a corresponding relationship, the adaptive loop gain control circuit raises the loop gain of the clock and data recovery circuit with the gain step value when the coefficient increases, and the adaptive loop gain control circuit lowers the loop gain of the clock and data recovery circuit with the gain step value when the coefficient decreases.

6. A clock and data recovery device, comprising:

a clock and data recovery circuit, having a data input terminal suitable for receiving a data signal, disposed to recover the data signal to a clock; and a jitter tolerance enhancement circuit, coupled to the data input terminal of the clock and data recovery circuit to receive the data signal, wherein the jitter tolerance enhancement circuit detects a correlation between the data signal and the clock and correspondingly adjusts a loop gain of the clock and data recovery circuit according to the correlation, wherein the jitter tolerance enhancement circuit comprises:

a jitter correlation detection circuit, coupled to the data input terminal of the clock and data recovery circuit to receive the data signal, wherein the jitter correlation detection circuit detects the correlation between the data signal and the clock, and the jitter correlation detection circuit outputs a coefficient corresponding to the correlation; and an adaptive loop gain control circuit, coupled to the jitter correlation detection circuit to receive the coefficient, wherein the adaptive loop gain control circuit correspondingly adjusts the loop gain of the clock and data recovery circuit according to the coefficient, wherein the jitter correlation detection circuit comprises:

a first delay circuit, coupled to the data input terminal of the clock and data recovery circuit to receive the data signal, wherein the first delay circuit outputs a first delayed data signal;

a second delay circuit, coupled to the clock and data recovery circuit to receive the clock, wherein the second delay circuit outputs a first delayed clock;

a third delay circuit, coupled to the data input terminal of the clock and data recovery circuit to receive the data signal, wherein the third delay circuit outputs a second delayed data signal;

a fourth delay circuit, coupled to the clock and data recovery circuit to receive the clock, wherein the fourth delay circuit outputs a second delayed clock; and a phase detection circuit, coupled to the clock and data recovery circuit, the first delay circuit, the second delay circuit, the third delay circuit, and the fourth delay circuit, wherein the phase detection circuit detects a phase relationship between the first delayed data signal and the first delayed clock to obtain a first detection result, the phase detection circuit detects a phase relationship between the second delayed data signal and the second delayed clock to obtain a second detection result, and the phase detection circuit outputs the coefficient corresponding to the first detection result and the second detection result to the adaptive loop gain control circuit.

7. The clock and data recovery device according to claim 6, wherein the phase detection circuit comprises:
 a first phase detector, coupled to the first delay circuit and the second delay circuit, wherein the first phase detector detects the phase relationship between the first delayed data signal and the first delayed clock to obtain the first detection result, and the first detection result indicates that whether a phase of the first delayed clock leads a phase of the first delayed data signal;
 a second phase detector, coupled to the third delay circuit and the fourth delay circuit, wherein the second phase detector detects the phase relationship between the second delayed data signal and the second delayed clock to obtain the second detection result, and the second detection result indicates that whether a phase of the second delayed clock lags a phase of the second delayed data signal;
 a first counter, coupled to the first phase detector to receive the first detection result, wherein the first counter is configured to count a number of occurrences of "the phase of the first delayed clock leads the phase of the first delayed data signal" in a counting period as a leading number value;
 a second counter, coupled to the second phase detector to receive the second detection result, wherein the second counter is configured to count a number of occurrences of "the phase of the second delayed clock lags the phase of the second delayed data signal" in the counting period as a lagging number value; and
 an adder, coupled to the first counter and the second counter to receive the leading number value and the lagging number value, wherein the adder outputs a total value of the leading number value and the lagging number value to act as the coefficient to the adaptive loop gain control circuit.

8. The clock and data recovery device according to claim 7, wherein the first phase detector and the second phase detector are bang-bang phase detectors.

9. A jitter tolerance enhancement method of a clock and data recovery device, comprising:
 recovering a data signal of a data input terminal to a clock by a clock and data recovery circuit;
 detecting a correlation between the data signal and the clock by a jitter tolerance enhancement circuit;
 correspondingly adjusting a loop gain of the clock and data recovery circuit according to the correlation by the jitter tolerance enhancement circuit;
 detecting the correlation between the data signal and the clock and outputting a coefficient corresponding to the correlation by a jitter correlation detection circuit;
 correspondingly adjusting the loop gain of the clock and data recovery circuit according to the coefficient by an adaptive loop gain control circuit;
 receiving the data signal and outputting a delayed data signal by a first delay circuit coupled to a data input terminal of the clock and data recovery circuit;
 receiving the clock and outputting a delayed clock by a second delay circuit coupled to the clock and data recovery circuit;
 detecting a phase relationship between the delayed data signal and the clock by a phase detection circuit to obtain a first detection result, wherein the phase detection circuit is coupled to the clock and data recovery circuit to receive the data signal and the clock, the phase detection circuit is coupled to the first delay circuit to receive the delayed data signal, and the phase detection circuit is coupled to the second delay circuit to receive the delayed clock;
 detecting a phase relationship between the data signal and the delayed clock by the phase detection circuit to obtain a second detection result; and
 outputting the coefficient corresponding to the first detection result and the second detection result by the phase detection circuit to the adaptive loop gain control circuit.

10. The jitter tolerance enhancement method according to claim 9, further comprising:
 detecting the phase relationship between the delayed data signal and the clock by a first phase detector to obtain the first detection result, wherein the first detection result indicates that whether a phase of the clock leads a phase of the delayed data signal;
 detecting the phase relationship between the data signal and the delayed clock by a second phase detector to obtain the second detection result, wherein the second detection result indicates that whether a phase of the delayed clock lags a phase of the data signal;
 counting a number of occurrences of "the phase of the clock leads the phase of the delayed data signal" in a counting period as a leading number value by a first counter;
 counting a number of occurrences of "the phase of the delayed clock lags the phase of the data signal" in the counting period as a lagging number value by a second counter; and
 outputting a total value of the leading number value and the lagging number value to act as the coefficient to the adaptive loop gain control circuit by an adder.

11. The jitter tolerance enhancement method according to claim 10,
 wherein the first phase detector and the second phase detector are bang-bang phase detectors.

12. The jitter tolerance enhancement method according to claim 9, further comprising:
 checking the coefficient by the adaptive loop gain control circuit;
 raising the loop gain of the clock and data recovery circuit by the adaptive loop gain control circuit when the coefficient increases, and
 lowering the loop gain of the clock and data recovery circuit by the adaptive loop gain control circuit when the coefficient decreases.

13. The jitter tolerance enhancement method according to claim 9, further comprising:
 calculating a coefficient difference value between the coefficient in a current counting period and the coefficient in a previous counting period by the adaptive loop gain control circuit;
 converting the coefficient difference value into a gain step value by the adaptive loop gain control circuit according to a corresponding relationship;

raising the loop gain of the clock and data recovery circuit with the gain step value by the adaptive loop gain control circuit when the coefficient increases; and lowering the loop gain of the clock and data recovery circuit with the gain step value by the adaptive loop gain control circuit when the coefficient decreases.

\* \* \* \* \*